United States Patent
Park (10) Patent No.: US 10,340,019 B2
(45) Date of Patent: Jul. 2, 2019

(54) SEMICONDUCTOR MEMORY DEVICE WITH IMPROVED PROGRAM VERIFICATION RELIABILITY

(71) Applicant: SK hynix Inc., Gyeonggi-do (KR)

(72) Inventor: Eun Young Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/862,269

(22) Filed: Jan. 4, 2018

(65) Prior Publication Data

US 2018/0130540 A1 May 10, 2018

Related U.S. Application Data

(62) Division of application No. 14/997,731, filed on Jan. 18, 2016, now Pat. No. 9,892,801.

(30) Foreign Application Priority Data

Jul. 20, 2015 (KR) .......................... 10-2015-0102494

(51) Int. Cl.
| | |
|---|---|
| *G11C 16/10* | (2006.01) |
| *G11C 16/24* | (2006.01) |
| *G11C 16/04* | (2006.01) |
| *G11C 16/34* | (2006.01) |

(52) U.S. Cl.
CPC ...... *G11C 16/3459* (2013.01); *G11C 16/0483* (2013.01); *G11C 16/10* (2013.01); *G11C 16/24* (2013.01); *G11C 2216/16* (2013.01)

(58) Field of Classification Search
CPC . G11C 16/3459; G11C 16/24; G11C 16/0483; G11C 16/10; G11C 16/26; G11C 2216/16
See application file for complete search history.

(56) References Cited

U.S. PATENT DOCUMENTS

| | | | | |
|---|---|---|---|---|
| 2011/0161571 | A1* | 6/2011 | Kim | G11C 11/5628 711/103 |
| 2016/0049192 | A1* | 2/2016 | Lee | G11C 16/3427 365/185.03 |

* cited by examiner

*Primary Examiner* — Harry W Byrne
*Assistant Examiner* — Sultana Begum
(74) *Attorney, Agent, or Firm* — IP & T Group LLP (57) ABSTRACT

A semiconductor memory device includes a memory cell array including first and second groups of memory strings respectively coupled to first and second groups of bit-lines, wherein the first and second groups of memory strings respectively include first and second groups of selection transistor cells; a peripheral circuit suitable for applying a program voltage, and performing program verification operation for the memory cell array; and a control logic suitable for controlling the peripheral circuit to perform a first program verification operation for the first group of selection transistor cells and a second program verification operation for the second group of selection transistor cells.

9 Claims, 8 Drawing Sheets

SEMICONDUCTOR MEMORY DEVICE WITH IMPROVED PROGRAM VERIFICATION RELIABILITY

CROSS-REFERENCE TO RELATED APPLICATION

This application is a division of U.S. patent application Ser. No. 14/997,731 filed on Jan. 18, 2016, which claims priority to Korean patent application number 10-2015-0102494, filed on Jul. 20, 2015. The disclosure of each of the foregoing applications is herein incorporated by reference in its entirety.

BACKGROUND

1. Field

The present disclosure relates to an electronic device, and more particularly, to a semiconductor memory device and an operation method thereof.

2. Discussion of Related Art

A semiconductor memory device may be implemented using a semiconductor such as silicon (Si), germanium (Ge), gallium arsenide (GaAs), indium phosphite (InP) or the like. The semiconductor memory device may be classified into volatile and nonvolatile memory devices.

In the volatile memory device, a power turn-off may cause loss of stored data therein. The volatile memory device may include Static RAM (SRAM), Dynamic RAM (DRAM), Synchronous DRAM (SDRAM) and the like. In the nonvolatile memory device, despite a power turn-off, the stored data therein may be maintained. The nonvolatile memory device may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM) and the like. Flash memory may be classified into NOR and NAND architectures.

Flash memory may have a combination of a RAM's advantage of a flexible data programming and erasing a ROM's advantage of a data maintaining in a power-off state. Flash memory has widely been employed as a storage medium of a portable electronic apparatus such as digital cameras, PDA Personal Digital Assistants, MP3 players, etc.

SUMMARY

Various embodiments of the present disclosure are directed to a semiconductor memory device having improved threshold voltage distribution of a selection transistor during a program operation and an operation method thereof.

In one aspect of the present disclosure, there is provided a semiconductor memory device including a memory cell array including first and second groups of memory strings respectively coupled to first and second groups of bit-lines, wherein the first and second groups of memory strings respectively include first and second groups of selection transistor cells; a peripheral circuit suitable for applying a program voltage, and performing program verification operation for the memory cell array; and a control logic suitable for controlling the peripheral circuit to perform a first program verification operation for the first group of selection transistor cells and a second program verification operation for the second group of the selection transistor cells, wherein the control logic is further suitable for performing the first program verification operation and the second program verification operation, respectively.

In one aspect of the present disclosure, there is provided a method of operating a semiconductor memory device having a memory cell array including first and second groups of memory strings respectively coupled to first and second groups of bit-lines, wherein the first and second groups of memory strings respectively include first and second groups of selection transistor cells, the method including applying a program voltage to the first and second groups of selection transistor cells; performing one of a first program verification operation for the first group of selection transistor cells and a second program verification operation for the second group of selection transistor cells; and determining pass or fail of both of the first and second program verification operations based on a result of one of the first and second program verification operations.

In one aspect of the present disclosure, there is provided a method of operating a semiconductor memory device having a memory cell array including first and second groups of memory strings respectively coupled to first and second groups of bit-lines, wherein the first and second groups of memory strings respectively include first and second groups of selection transistor cells, the method including applying a program voltage to the first and second groups of selection transistor cells; selectively performing a first program verification operation for the first group of selection transistor cells or a second program verification operation for the second group of selection transistor cells based on application numbers of the program voltage; and determining pass or fail of the first or second program verification operations based on a result of currently performed one of the first and second program verification operations.

In one aspect of the present disclosure, there is provided a method of operating a semiconductor memory device having a memory cell array including plural memory strings respectively coupled to plural of bit-lines, wherein the plural memory strings include plural selection transistor cells, the method including applying a program voltage to the plural selection transistor cells; performing a program verification operation for the plural selection transistor cells by comparing cell currents of the plural selection transistor cells with a predetermined value; and determining pass or fail of the program verification operation.

In one aspect of the present disclosure, there is provided a method of operating a semiconductor memory device having a memory cell array including first and second groups of memory strings respectively coupled to first and second groups of bit-lines, wherein the first and second groups of memory strings respectively include first and second groups of selection transistor cells, and having a plurality of page buffers, each of which is coupled to a pair of a first bit-line of the first group of bit-lines and a second bit-line of the second group of bit-lines, the method including applying a program voltage to the plural selection transistor cells; performing a program verification operation for the first and second groups of selection transistor cells based on cell currents of the first and second groups of memory strings measured by the plural page buffers; and determining pass or fail of the program verification operation.

In accordance with the present disclosure, a threshold voltage distribution of the selection transistor in the program operation of the semiconductor memory device may be improved.

BRIEF DESCRIPTION OF THE DRAWINGS

A brief description of each drawing is provided to more fully understand the drawings, which is incorporated in the detailed description of the invention.

DETAILED DESCRIPTIONS

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in detail with reference to attached drawings.

Figure 1:
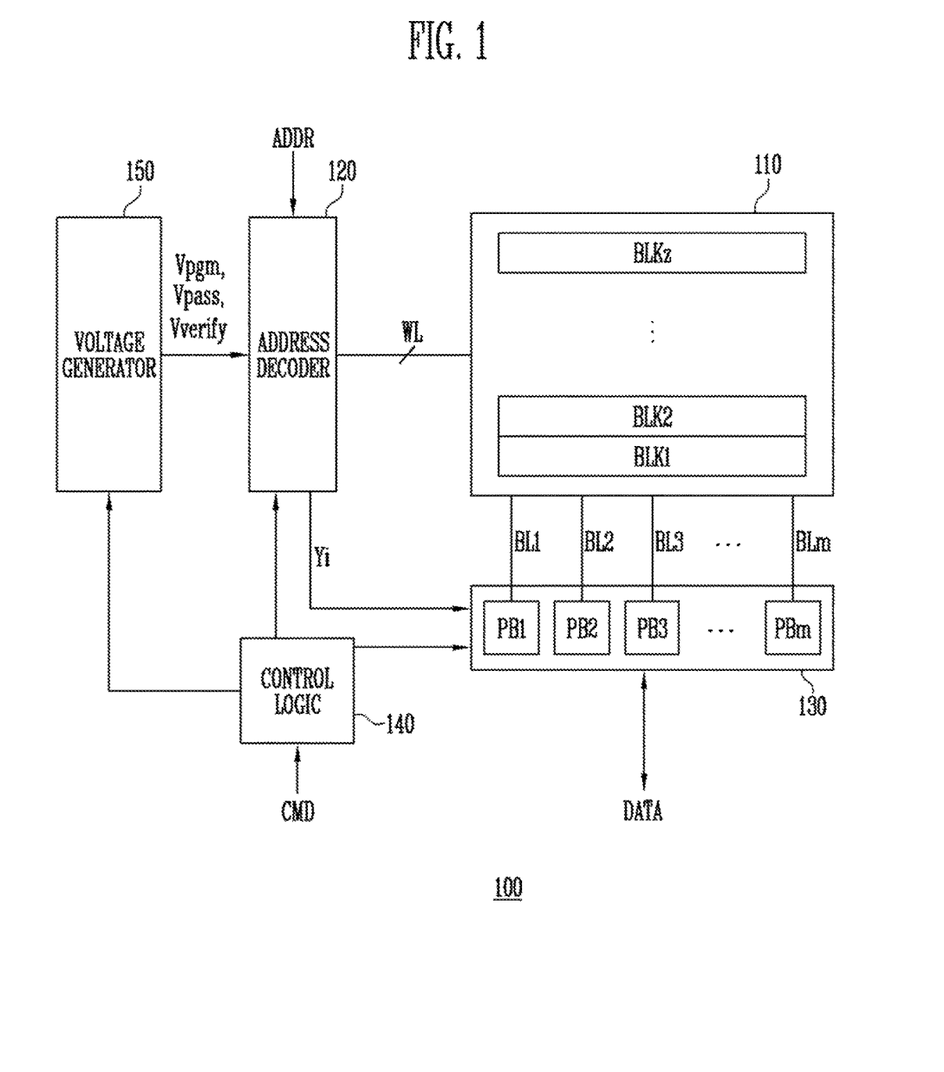
FIG. 1 is a block diagram of a semiconductor memory device in accordance with the present disclosure.

FIG. 1 is a block diagram of a semiconductor memory device 100 in accordance with the present disclosure.

Referring to FIG. 1, the semiconductor memory device 100 may include a memory cell array 110, an address decoder 120, a read and program circuit 130, a control logic 140, and a voltage generator 150.

The memory cell array 110 may include a plurality of memory blocks BLK1 to BLKz. The plurality of memory blocks BLK1 to BLKz are connected to the address decoder 120 through word-lines WL. The plurality of memory blocks BLK1 to BLKz are connected to the read and program circuit 130 through bit-lines BL1 to BLm. The bit-lines BL1 to BLm may be divided into an even bit-line group and an odd bit-line group. Each memory block BLK1 to BLKz may include a plurality of the memory cells. In one implementation, the plurality of the memory cells are embodied in non-volatile memory cells. In one example, the plurality of the memory cells are implemented in charge-trap device-based non-volatile memory cells. The plurality of the memory cells may be grouped into a plurality of pages, with each page including memory cells, all of which are coupled to a single word-line. That is, the memory cell array 110 may be divided into a multiplicity of pages. Further, each memory block BLK1 to BLKz of the memory cell array 110 may include a plurality of memory strings. Each memory string may include a drain selection transistor cell, a plurality of the memory cells, and a source selection transistor cell, all of which are serially connected between a bit-line and a source-line. The plurality of strings may be divided into first memory strings coupled to even bit-lines, and second memory strings coupled to odd bit-lines and being adjacent to the first memory strings. Single first string and single second string may be coupled to different common source-line or to a single common source-line.

The address decoder 120, the read and program circuit 130, and the voltage generator 150 serve collectively as a peripheral circuit to drive the memory cell array 110.

The address decoder 120 is connected to the memory cell array 110 through the word-lines WL. The address decoder 120 operates under control of the control logic 140. The address decoder 120 may receive an address ADDR through the input/output buffer (not shown) in the semiconductor memory device 100.

The address decoder 120 applies a program voltage Vpgm and a pass voltage Vpass generated by the voltage generator 150 to a plurality of word-lines WL of the memory cell array 110 in accordance with a decoded column address from the received address ADDR through a program voltage application operation during a program operation and to a select-line coupled to a selection transistor cell for a program operation of the selection transistor cell. Further, the address decoder 120 applies a verification voltage Vverify generated by the voltage generator 150 to a selected word-line or selected select-line through a verification operation during the program operation. The address decoder 120 decode a row address from the received address ADDR during a read operation. The address decoder 120 sends the decoded row address Yi to the read and program circuit 130.

The semiconductor memory device 100 may perform the read and program operations on a page basis. The address ADDR provided with a program operation request may contain a block address, a column address and a row address. The address decoder 120 may select a single memory block and a single word-line based on the block address and column address. The row address may be decoded by the address decoder 120 and, in turn, be fed to the read and program circuit 130.

The semiconductor memory device 100 may selectively program only the drain selection transistor cells and the source selection transistor cells. The programmed drain selection transistor cells and source selection transistor cells may block a leakage current from non-selected strings during operations of the semiconductor memory device 100.

The address decoder 120 may include a block decoder, a column decoder, a row decoder and an address buffer, etc.

The read and program circuit 130 may include a plurality of page buffers PB1 to PBm. The plurality of page buffers PB1 to PBm are coupled to the memory cell array 110 through the bit-lines BL1 to BLm. The plurality of page buffers PB1 to PBm temporarily store data to be programmed during a program operation, and control potentials of corresponding bit-lines BL1 to BLm based on the temporarily stored data. Further, during a program verification (PV) operation, each page buffer PB1 to PBm detects cell currents through the corresponding bit-lines BL1 to BLm of the memory cell array 110, and performs a verification operation based on the detected cell currents.

The read and program circuit 130 operates under control of the control logic 140. In one implementation, the read and program circuit 130 may include page buffers or page registers, a row selection circuit, etc.

The control logic 140 is coupled to the address decoder 120, the read and program circuit 130, and the voltage generator 150. The control logic 140 receives a command CMD through an input/output buffer (not shown) of the semiconductor memory device 100. The control logic 140 controls operations of the semiconductor memory device 100 in response to the command CMD. Furthermore, the control logic 140 controls the address decoder 120, the read and program circuit 130, and the voltage generator 150 so as to program the drain and the source selection transistor cells of the plurality of memory blocks. The control logic 140 may perform a selective program verification (hereinafter, PV operation) only for the drain and the source selection transistor cells coupled to even or odd bit-lines among the plurality of bit-lines during a program operation of the drain and the source selection transistor cells. Further, the control logic 140 may alternately perform the PV operation to the drain and the source selection transistor cells coupled to even bit-lines and odd bit-lines during the PV operation of the drain and the source selection transistor cells. The control logic 140 may also concurrently perform the PV operation to the drain and the source selection transistor cells coupled to even bit-lines and odd bit-lines during the PV operation of the drain and the source selection transistor cells.

The voltage generator 150 generates the program voltage Vpgm and pass voltage Vpass under control of the control logic 140 in a program voltage application operation. The voltage generator 150 generates the program voltage Vpgm increasing by steps in proportion to a number of the voltage applications. The voltage generator 150 generates a verification voltage Vverify under control of the control logic 140 during the PV operation.

Figure 2:
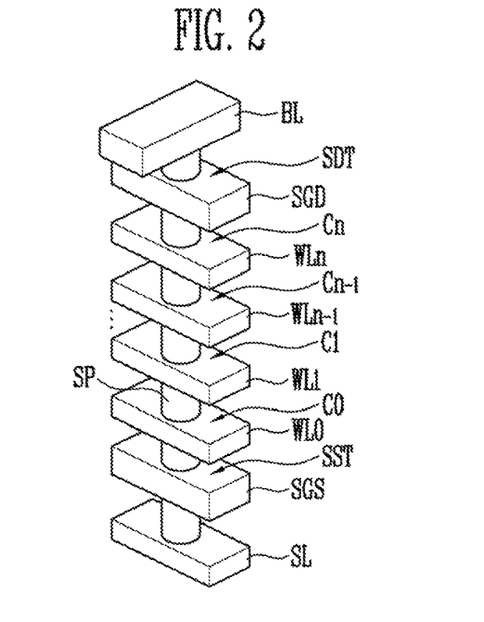
FIG. 2 is a perspective view of a memory string contained in a memory block in accordance with the present disclosure.

FIG. 2 is a perspective view of a memory string contained in a memory block in accordance with the present disclosure.

Referring to FIG. 2, a common source-line SL is formed on a semiconductor substrate. On the common source-line SL, there is formed a vertical channel layer SP. The vertical channel layer SP has a top portion connected to a bit-line BL. The vertical channel layer SP may be made of a polysilicon. At each of different levels of the vertical channel layer SP, there is formed one of a plurality of conductive films SGS, WL0 to WLn, SGD to surround the vertical channel layer SP. On a surface of the vertical channel layer SP, there may be formed a stack (not shown) including a charge storage film. Each stack may be also formed between the vertical channel layer SP and each of the conductive films SGSL, WL0 to WLn, and SGD. Each stack may be implemented in a stack of an oxide film, a nitride film, and an oxide film in this order (ONO stack).

A lowest conductive film acts as the source select-line (or a first select-line) SGS, while a highest conductive film acts as the drain select-line (or a second select-line) SGD. The conductive films between the select-lines SGS and SGD act as the word-lines WL0 to WLn. In other words, on the semiconductor substrate, the conductive films SGS, WL0 to WLn, and SGD are formed, through which the vertical channel layer SP passes to extend between the bit-line BL and the source-line SL.

At an intersection of the uppermost conductive film SGD and the vertical channel layer SP, there is formed the drain selection transistor cell or second selection transistor SDT, while at an intersection of the lowest conductive film SGS and the vertical channel layer SP, there is disposed the source selection transistor cell or first selection transistor SST. At each of the intersections between the intermediate conductive films WL0 to WLn and the vertical channel layer SP, there is formed the memory cells C0 to Cn.

Through the above configuration, the memory string includes the source selection transistor SST, the memory cells C0 to Cn and the drain selection transistor SDT, all of which are vertically coupled in a series between the common source-line SL and the bit-line BL on the substrate. The source selection transistor SST electrically connects the memory cells C0 to Cn to the common source-line SL based on a first selection signal applied to the first select-line SGS. The drain selection transistor SDT electrically couples the memory cells C0 to Cn to the bit-line BL based on a second selection signal applied to the second select-line SGD.

Figure 3:
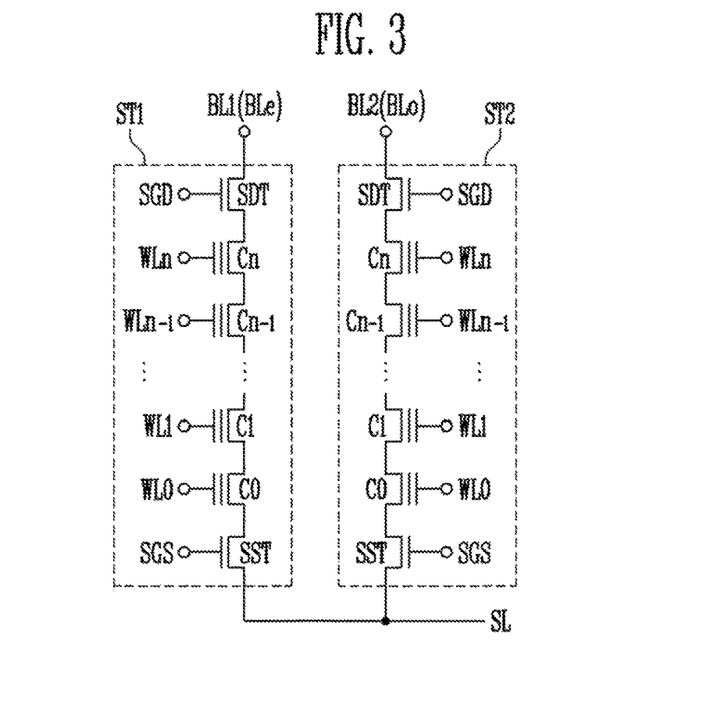
FIG. 3 is a circuit diagram illustrating a first and second memory string.

FIG. 3 is a circuit diagram illustrating a first and second memory string.

Referring to FIG. 3, the first memory string ST1 includes the drain selection transistor SDT, the memory cells C0 to Cn and the source selection transistor SST, all of which are serially coupled between a first bit-line BL1 as an even bit-line BLe and the common source-line SL. The second memory string ST2 includes the drain selection transistor SDT, the memory cells C0 to Cn and the source selection transistor SST, all of which are serially coupled between a second bit-line BL2 as an odd bit-line BLo and the common source-line SL.

The first memory string ST1 and second memory string ST2 may be adjacent to each other and share the single common source-line SL, but may be coupled respectively to the first bit-line BL1 and second bit-line BL2 electrically isolated from each other.

Since the drain selection transistor SDT and the source selection transistor SST contained in each of the first and second memory strings ST1 and ST2 share the common source-line SL during the PV operation, the program verification operation may not be correctly performed, which causes over-sufficient program or under-sufficient program. When the drain selection transistor SDT and the source selection transistor SST are in the over-sufficient programmed state, the channels are pre-charged to a potential level below a target level due to threshold voltage of the drain selection transistor SDT and the source selection transistor SST during a pre-charge operation of the channels of the first memory string ST1 and second memory string ST2. When the drain selection transistor SDT and the source selection transistor SST are in the under-sufficient programmed state, leakage currents from the first and second memory strings ST1 and ST2 occur although the first and second strings are not selected, which causes a "programming disturb".

Although embodiments of the present disclosure will be described with reference to the configuration where the first memory string ST1 and second memory string ST2 share the single common source-line, the present disclosure may be applied to a configuration where the first memory string ST1 and second memory string ST2 are coupled to different common source-lines.

Figure 4:
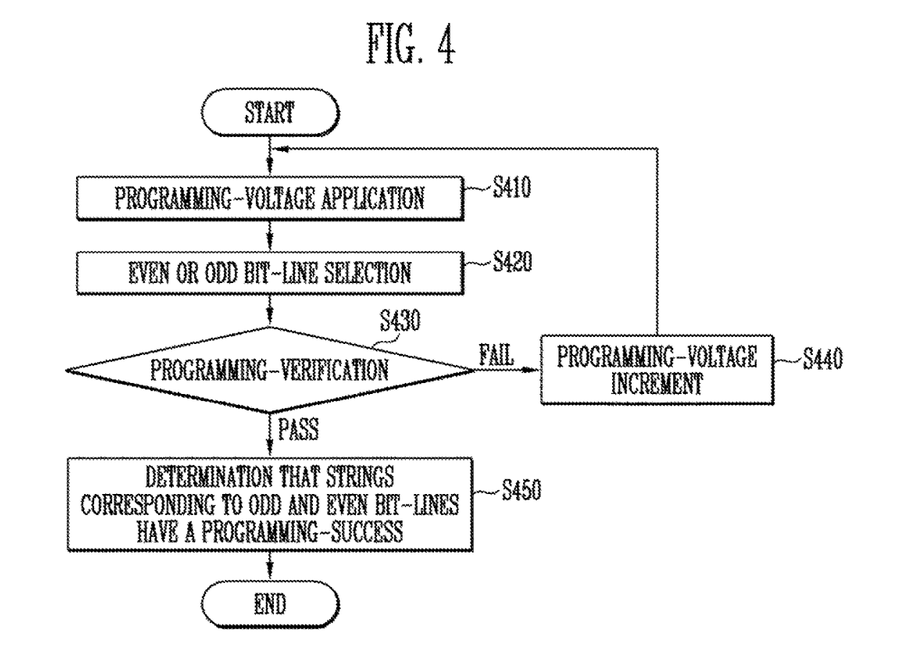
FIG. 4 is a flow chart of an operation method of a semiconductor memory device according to one embodiment of the present disclosure.

FIG. 4 is a flow chart of an operation method of the semiconductor memory device according to one embodiment of the present disclosure.

Referring to FIG. 1 to FIG. 4, a program operation of each of the selection transistor cells of the semiconductor memory device will be described.

Programming-Voltage Application (Step S410)

The read and program circuit 130 temporarily stores data to be programmed DATA and sets potential levels of the bit-lines BL1 to BLm to a program permission voltage based on the stored data.

The voltage generator 150 generates the program voltage Vpgm to be applied to the source select-line SGS coupled to the source selection transistor cell, as well as the pass voltage Vpass to be applied to the word-lines WL.

The address decoder 120 applies the program voltage Vpgm to the source select-line SGS and the pass voltage Vpass to the word-lines WL based on the address signal ADDR. At this time, the drain select-line SGD are supplied with an operation voltage to turn on the drain selection transistor cell.

Even or Odd Bit-Line Selection (Step S420)

The control logic 140 selects one of the even bit-line group and the odd bit-line group from the plurality of bit-lines BL1 to BLm for the PV operation. That is, to perform a half page PV operation for a half of pages among all of the pages, one of the even bit-line group and the odd bit-line group is selected from the plurality of bit-lines BL1 to BLm.

Thus, one of the first memory string ST1 and one of the second memory string ST2 sharing the common source-line SL are selected.

Programming-Verification (Step S430)

The half page PV operation is carried out for memory strings coupled to the even bit-line group and the odd bit-line group selected at step S420.

The voltage generator 150 generates a verification voltage Vverify to be applied to the source select-line SGS coupled to the source selection transistor cell, and generates a pass voltage Vpass to be applied to the word-lines WL.

The address decoder 120 applies the generated verification voltage Vverify and pass voltage Vpass respectively to the source select-line SGS and word-lines WL.

The read and program circuit 130 performs the half page PV operation using page buffers coupled to the selected even bit-line group or odd bit-line group.

When the number of the transistor cells determined as PV pass among the source selection transistor cells contained in the memory strings coupled to the selected even bit-line group or odd bit-line group is equal to or greater than a predetermined number, the control logic 140 determines the half page PV operation as pass. When the number of the transistor cells determined as PV pass is less than the predetermined number, the control logic 140 determines the half page PV operation as fail.

Programming Voltage Increment (Step S440)

When the half page PV operation fails as the determination of step S430, the current program voltage is raised by a step voltage at step S440 and steps S410 to S430 are repeated.

Verification Pass Determination (Step S450)

When the half page PV operation is determined as pass as the determination of step S430, the source selection transistor cells SSTs of the memory strings coupled to both of the selected bit-line group and the non-selected bit line group, or both of the even and odd bit-line groups, are determined as program pass.

As described above, in one embodiment of the present disclosure, the program pass determination of all the pages is based on the half page program verification for a half of the pages. This is because a threshold voltage distribution among the source selection transistor cells SSTs can be regarded as uniform by programming all of the memory strings with the same value.

Figure 5:
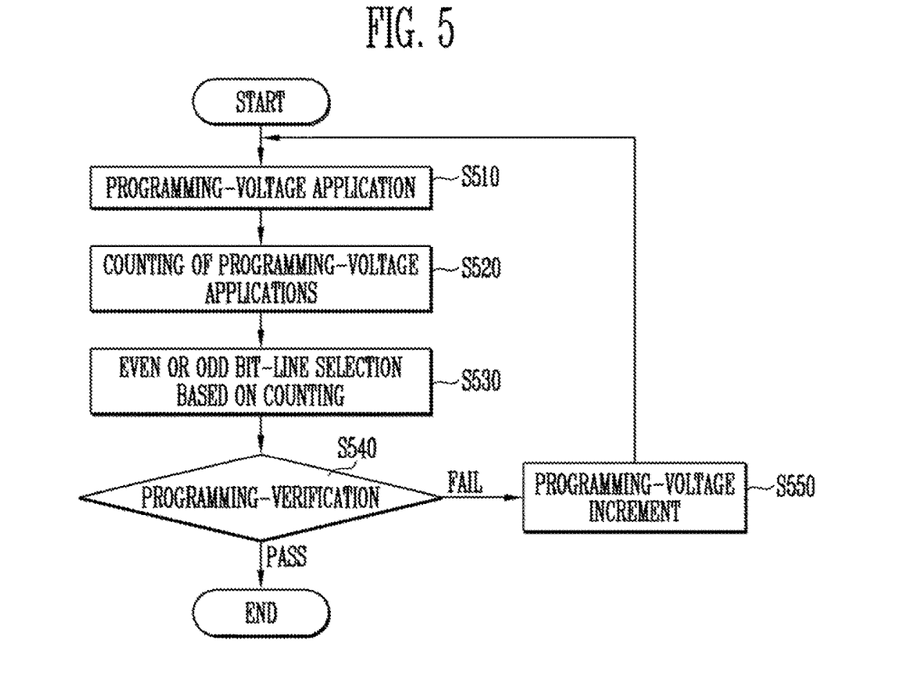
FIG. 5 is a flow chart of an operation method of a semiconductor memory device in accordance with one embodiment of the present disclosure.

FIG. 5 is a flow chart of an operation method of the semiconductor memory device in accordance with one embodiment of the present disclosure.

Figure 6A:
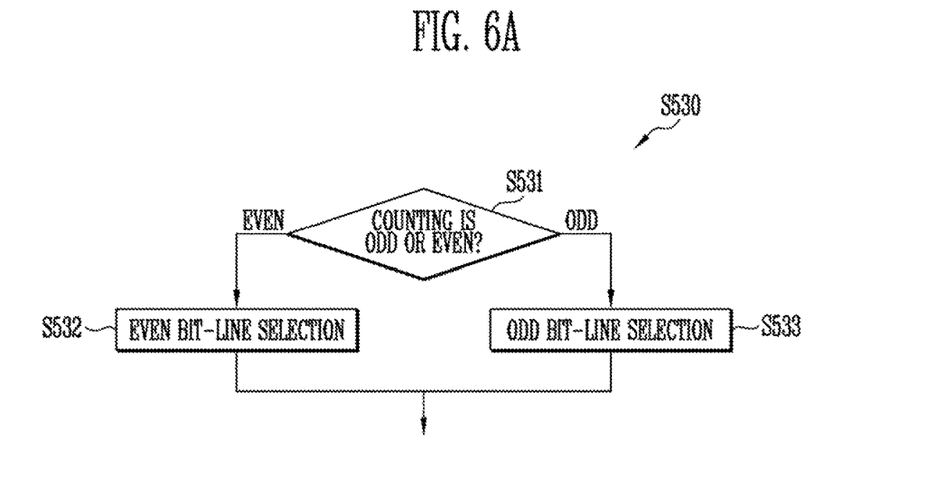
FIG. 6A and FIG. 6B are flow charts illustrating step S530 in FIG. 5.
Figure 6B:
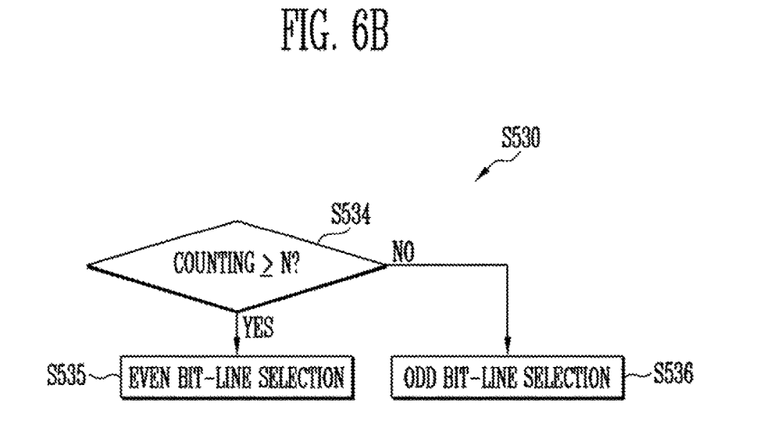

FIG. 6A and FIG. 6B are flow charts illustrating step S530 in FIG. 5.

Referring to FIG. 1 to FIG. 3, and FIG. 5 to FIG. 6B, the program operation of the selection transistor cells of the semiconductor memory device will be described.

Programming-Voltage Application (Step S510)

The read and program circuit 130 temporarily stores data to be programmed DATA, and sets potential levels of the bit-lines BL1 to BLm to a program permission voltage based on the stored data.

The voltage generator 150 generates the program voltage Vpgm to be applied to the source select-line SGS coupled to the source selection transistor cell, and generates the pass voltage Vpass to be applied to the word-lines WL.

The address decoder 120 applies the program voltage Vpgm to the source select-line SGS, and applies the pass voltage Vpass to the word-lines WL based on the address signal ADDR. At this time, the drain select-line SGD is supplied with an operation voltage to turn on the drain selection transistor cell.

Programming Voltage Application Counting (Step S520)

The control logic 140 counts application numbers of the program voltage of step S510 and temporarily stores the count value.

Even or Odd Bit-Line Selection (Step S530)

The control logic 140 selects one of the even bit-line group and the odd bit-line group from the plurality of bit-lines BL1 to BLm for the half page PV operation based on the count value of step S520. That is, to perform the half page PV operation for a half of pages among all of the pages, one of the even bit-line group and one of the odd bit-line group are selected from bit-lines BL1 to BLm based on the application numbers of the program voltage of step S510.

Step S530 may be carried out in two approaches as follows.

In a first approach, with reference to FIG. 6A, a determination is made as to whether the count value of step S520 is odd or even at step S531. Based on the determination result, the control logic 140 selects one of the even bit-line group or one of the odd bit-line group from bit-lines BL1 to BLm at steps S532 and S533.

Through the first approach, the half page PV operation is performed in an alternate manner between the memory strings coupled to the even bit-line group and the odd bit-line group.

In a second approach, with reference to FIG. 6B, a comparison is performed between the count value of step S520 and a predetermined number at step S534. Based on the comparison result, the control logic 140 selects one of the even bit-line group orone of the odd bit-line group from bit-lines BL1 to BLm at steps S535 and S536.

Through the second approach, the half page PV operation is performed in a successive manner where the predetermined number of the memory strings coupled to the odd bit-line group are successively verified and then the memory strings coupled to the even bit-line group are successively verified.

In addition to the first and second approaches, there may be a combination approach of the first and second approaches, where successive half page PV operations of the predetermined number of the memory strings coupled to the even bit-line group may be alternated with successive half page PV operations of the predetermined number of the memory strings coupled to the odd bit-line group.

Programming-Verification (Step S540)

The half page PV operation is carried out for memory strings coupled to the one of the even bit-line group or the odd bit-line group selected at step S530.

The voltage generator 150 generates a verification voltage Vverify to be applied to the source select-line SGS coupled to the source selection transistor cell, and generates a pass voltage Vpass to be applied to the word-lines WL.

The address decoder 120 applies the generated verification voltage Vverify and pass voltage Vpass respectively to the source select-line SGS and word-lines WL.

The read and program circuit 130 performs the half page PV operation using page buffers coupled to the selected even bit-line group or odd bit-line group.

When the number of the transistor cells determined as PV pass among the source selection transistor cells contained in the memory strings coupled to the selected even bit-line group or odd bit-line group is equal to or greater than a predetermined number, the control logic 140 determines the half page PV operation as pass. When the number of the transistor cells determined as PV pass is less than the predetermined number, the control logic 140 determines the half page PV operation as fail.

Programming Voltage Increment (Step S550)

When the half page PV operation fails as the determination of step S540, the current program voltage is raised by a step voltage at step S550 and steps S510 to S540 may be repeated.

In the embodiment where the half page PV operations are alternated between the memory strings coupled to the even bit-lines and the odd bit-lines, the half page PV operation accuracy is enhanced and, further, the threshold voltage distribution of the source selection transistor cells SST is improved.

Although, in one embodiment, an entire half page PV process ends after the half page PV operation only for either the first memory strings or the second memory strings coupled to the even bit-lines or odd bit-lines respectively, the present disclosure is not limited thereto. In one example, the half page PV operations for the first strings are performed, and, then, half page PV operations for the second strings are further performed. Further, after the half page PV operations for the second strings, the half page PV operations for the first strings are further performed. This leads to a further improved PA operation reliability.

Figure 7:
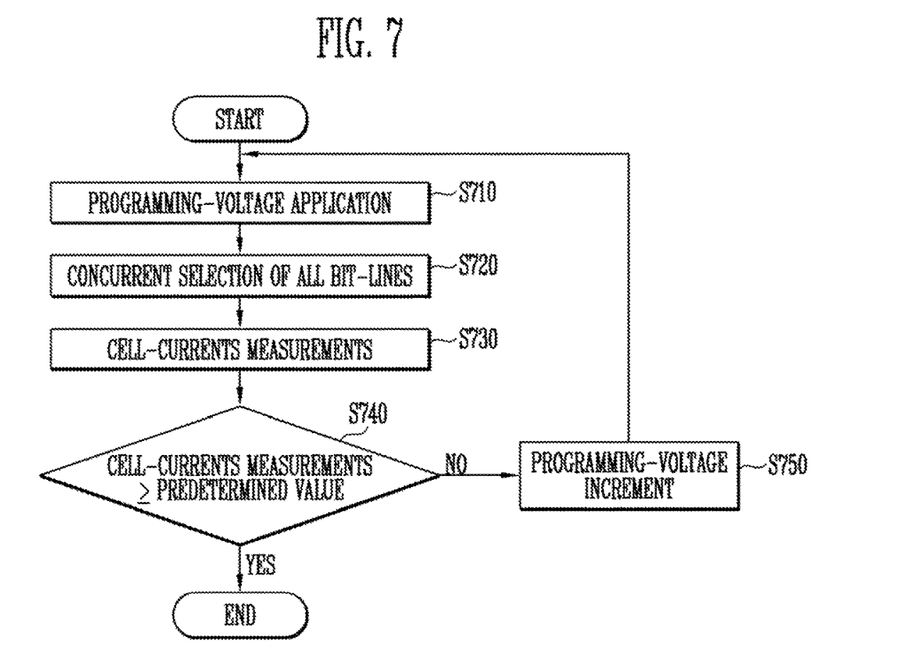
FIG. 7 is a flow chart of an operation method of a semiconductor memory device according to one embodiment of the present disclosure.

FIG. 7 is a flow chart of an operation method of the semiconductor memory device according to one embodiment of the present disclosure.

Referring to FIG. 1 to FIG. 3 and FIG. 7, the program operation of the selection transistor cells of the semiconductor memory device will be described.

Programming-Voltage Application (Step S710)

The read and program circuit 130 temporarily stores data to be programmed DATA and sets potential levels of the bit-lines BL1 to BLm to a program permission voltage based on the stored data.

The voltage generator 150 generates the program voltage Vpgm to be applied to the source select-line SGS coupled to the source selection transistor cell, and generates the pass voltage Vpass to be applied to the word-lines WL.

The address decoder 120 applies the program voltage Vpgm to the source select-line SGS, and applies the pass voltage Vpass to the word-lines WL based on the address signal ADDR. At this time, the drain select-line SGD is supplied with an operation voltage to turn on the drain selection transistor cell.

Concurrent Selection of all Bit-Lines (Step S720)

The control logic 140 controls the peripheral circuits to select all of the bit-lines BL1 to BLm for the PV operation.

Current-Measurement for all Cells (Step S730)

The voltage generator 150 generates a verification voltage Vverify to be applied to the source select-line SGS coupled to the source selection transistor cell, and generates a pass voltage Vpass to be applied to the word-lines WL.

The address decoder 120 applies the generated verification voltage Vverify and pass voltage Vpass respectively to the source select-line SGS and word-lines WL.

The read and program circuit 130 measures all cell currents using all page buffers coupled to all bit-lines.

Programming-Verification Based on Current Measurements (Step S740)

The control logic 140 performs the PV operation through a comparison between the measured all cell currents of step S730 and a predetermined value. The predetermined value is set to a cell current sum corresponding to a case when all of the source selection transistor cells are programmed to have voltages above a target threshold voltage.

When the measured all cell currents of step S730 is greater than or equal to the predetermined value, the PV operation is determined as pass. When the measured cell currents of step S730 is less than the predetermined value, the PV operation is determined as fail.

Programming Voltage Increment (Step S750)

When the PV operation fails as the determination of step S740, the current program voltage is raised by a step voltage at step S750 and steps S710 to S740 may be repeated.

In the embodiment, all of the memory strings coupled to all bit-lines are subjected to the verification where the measured all cell currents are compared to the predetermined value.

Figure 8:
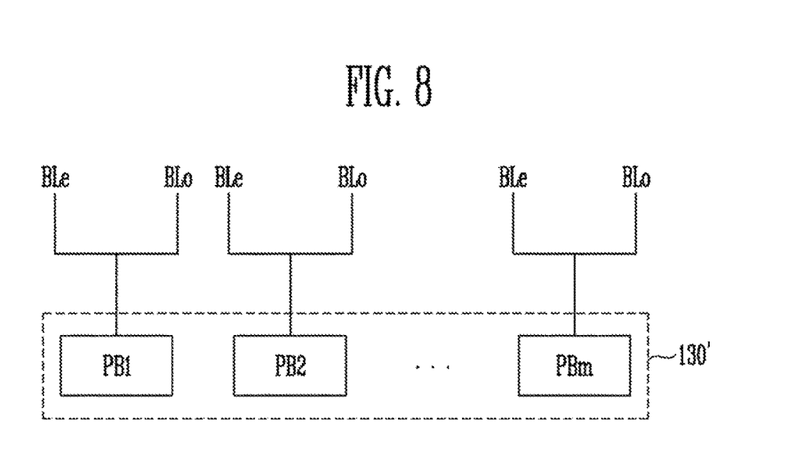
FIG. 8 is a block diagram of one implementation of a read and program circuit in FIG. 1.

FIG. 8 is a block diagram of one implementation of the read and program circuit in FIG. 1.

Referring to FIG. 8, a read and program circuit 130' has the plural page buffers PB1 to PBm coupled to plural pairs of single even and odd bit-lines Ble and BLo, respectively.

Figure 9:
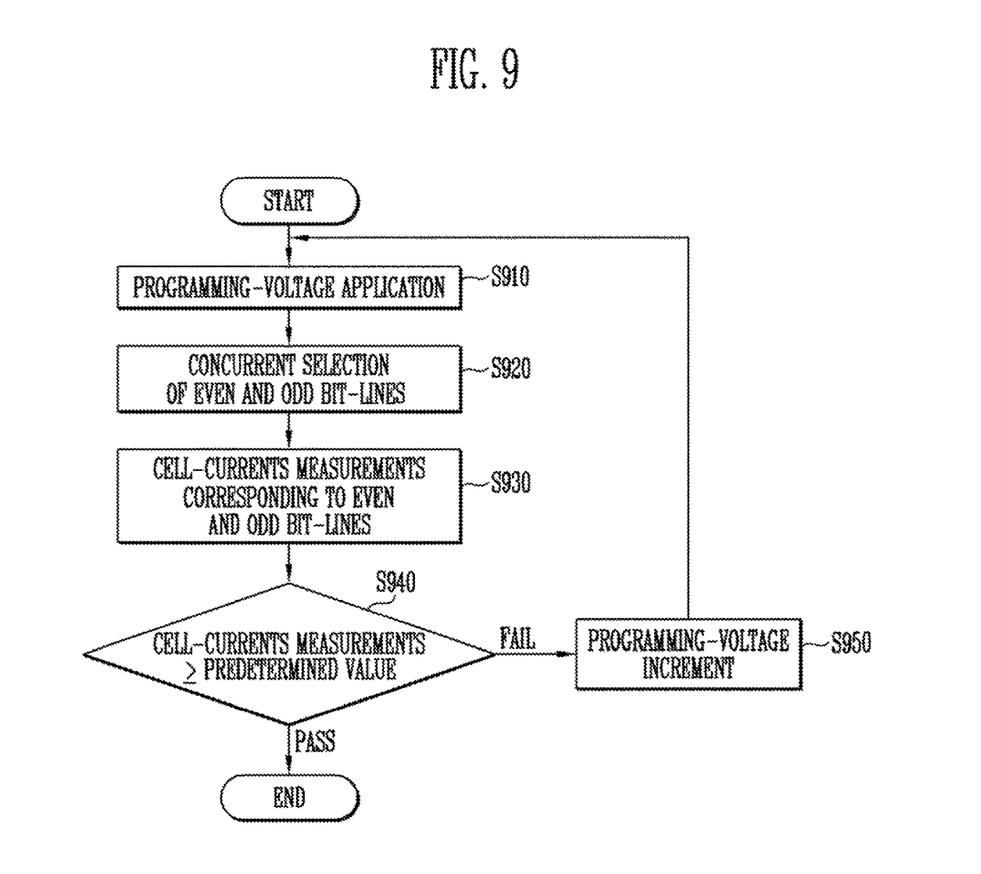
FIG. 9 is a flow chart of an operation method of a semiconductor memory device according to one embodiment of the present disclosure.

FIG. 9 is a flow chart of an operation method of the semiconductor memory device according to one embodiment of the present disclosure.

Referring to FIGS. 1 to 3, FIG. 8, and FIG. 9, a program operation of each of the selection transistor cells of the semiconductor memory device will be described.

Programming Voltage Application (Step S910)

The read and program circuit 130' temporarily stores data to be programed DATA and sets potential levels of even and odd bit-lines BLe and BLo to a program permission voltage based on the stored data.

The voltage generator 150 generates the program voltage Vpgm to be applied to the source select-line SGS coupled to the source selection transistor cell, and generates the pass voltage Vpass to be applied to the word-lines WL.

The address decoder 120 applies the program voltage Vpgm to the source select-line SGS, and applies the pass voltage Vpass to the word-lines WL based on the address signal ADDR. At this time, the drain select-line SGD is supplied with an operation voltage to turn on the drain selection transistor cell.

Concurrent Selection of Even and Odd Bit-Lines (Step S920)

The control logic 140 controls the read and program circuit 130' to select both of the even bit-line Ble and the odd bit-line BLo commonly coupled to each of the buffers PB1 to PBm.

Cell Current Measurements for Even and Odd Bit-Lines (Step S930)

The voltage generator 150 generates a verification voltage Vverify to be applied to the source select-line SGS coupled to the source selection transistor cell, and generates a pass voltage Vpass to be applied to the word-lines WL.

The address decoder 120 applies the generated verification voltage Vverify and pass voltage Vpass to the source select-line SGS and word-lines WL respectively.

The read and program circuit 130' measures each cell current of the plural pairs of the even bit-lines BLe and the odd bit-lines BLo respectively coupled to the page buffers PB1 to PBm.

Programming-Verification (Step S940)

The read and program circuit 130' performs the PV operation through comparison between the measured cell current of step S930 with a predetermined value. It is exemplarily assumed that the predetermined value is about 50 nmA. The predetermined value of 50 nmA corresponds to a cell current flowing in a single bit-line coupled to a memory cell determined as PV pass. Along with this assumption, when the measured cell current of step S930 is greater than or equal to 100 mA, both of the source selection transistor cells SGT included in the memory strings coupled to the even bit-line BLe and odd bit-line BLo are determined as PV pass. When the measured cell current of step S930 is greater than or equal to 50 mA and less than 100 mA, one source selection transistor cell SGT included in the memory strings coupled to the even bit-line BLe and odd bit-line BLo is determined as PV pass. Further, when the measured cell current of step S930 is less than 50 mA, both of source selection transistor cells SGT included in memory strings coupled to the even bit-line BLe and odd bit-line BLo are determined as PV fail.

When the number of the memory cells determined as PV pass for the plural page buffers PB1 to PBm is greater than or equal to a predetermined number, the PV operation is determined as pass. Otherwise, the PV operation is determined as fail.

Programming Voltage Increment (Step S950)

When the PV operation fails as the determination of step S940, the current program voltage is raised by a step voltage at step S950 and steps S910 to S940 may be repeated.

In the embodiment, the PV operations for two memory strings are performed concurrently using a single page buffer, leading to the reduced program operation time.

Although the above embodiments of the present disclosure have been described with connection to the program operation of the source selection transistor cells, the embodiments may be equally applied to a program operation of the drain selection transistor cells.

Figure 10:
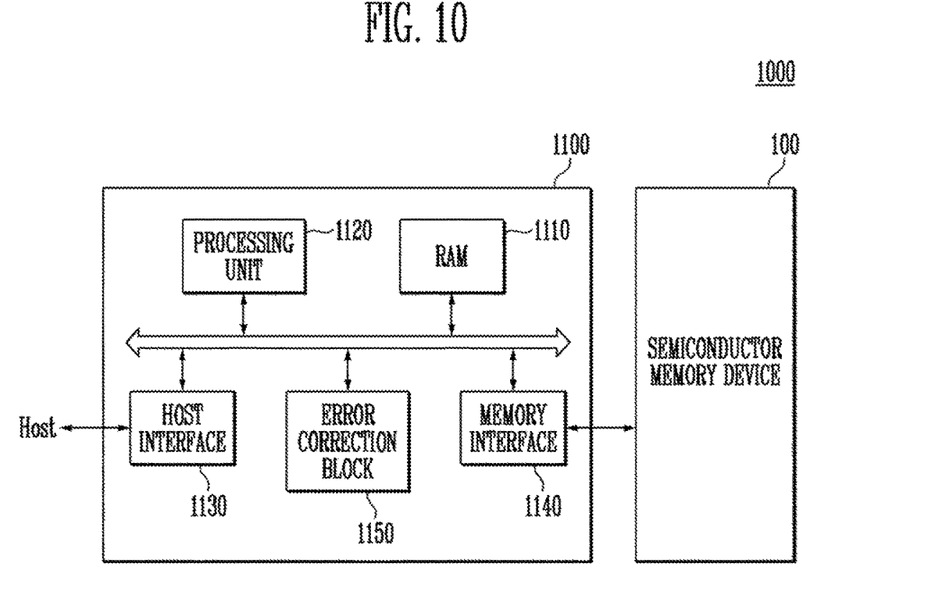
FIG. 10 is a block diagram of a memory system including a semiconductor memory device.

FIG. 10 is a block diagram of a memory system including the semiconductor memory device in FIG. 1.

Referring to FIG. 10, the memory system 1000 may include the semiconductor memory device 100 and controller 1100.

A configuration and operation of the semiconductor memory device 100 may be as in FIG. 1.

The controller 1100 is connected to a host (system) and the semiconductor memory device 100. In response to a request from a host, the controller 1100 accesses the semiconductor memory device 100. In an example, the controller 1100 controls reading, writing, erasing, and background operations of the semiconductor memory device 100. The controller 1100 interfaces between the semiconductor memory device 100 and the host. The controller 1100 may drive firmware to control the semiconductor memory device 100.

The controller 1100 may include RAM 1110 (Random Access Memory), processing unit 1120, host interface 1130, memory interface 1140, and error correction block 1150. The RAM 1110 acts as a work memory of the processing unit 1120, a cache memory between the semiconductor memory device 100 and the host system, and/or a buffer memory between the semiconductor memory device 100 and host. The processing unit 1120 controls all of operations of the controller 1100. Further, the controller 1100 temporarily stores data to be programmed that is supplied from the host in a writing operation.

The host interface 1130 may include a protocol used to exchange data between the host and controller 1100. In one implementation, the controller 1200 is configured with the host through various interface protocols. The protocol may include, but be not limited to, a USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol, SCSI (small computer small interface) protocol, ESDI (enhanced small disk interface) protocol, and IDE (Integrated Drive Electronics) protocol, private protocol or the like.

The memory interface 1140 interfaces with the semiconductor memory device 100 (e.g., the memory interface NAND interface or NOR interface).

The error correction block 1150 detects and corrects an error in data received from the semiconductor memory device 100 using an error correction code ECC. The processing unit 1120 controls the semiconductor memory device 100 to adjust a reading voltage based on an error detection result of the error correction block 1150 for a subsequent reading repetition. In one implementation, the error correction block is provided as a component of the controller 1100.

The controller 1100 and the semiconductor memory device 100 may be integrated into a single semiconductor device. In one implementation, the controller 1100 and the semiconductor memory device 100 may be integrated into the single semiconductor device to form a memory card. For example, the integration into the single semiconductor device may implement a memory card such as a PC card (PCMCIA, personal computer memory card international association), compact flash card (CF), smart media card (SM, SMC), memory stick, multimedia card (MMC, RS-MMC, MMCmicro), SD card (SD, miniSD, microSD, SDHC), universal flash memory device (UFS), etc.

The integration of the controller 1100 and the semiconductor memory device 100 into the single semiconductor device may implement a semiconductor drive (SSD, Solid State Drive). The semiconductor drive (SSD) may refer to a storage device configured to store data in the semiconductor memory. When the memory system 1000 is implemented as the semiconductor drive (SSD), this may lead to a considerable enhancement in an operation rate of the host system coupled to the memory system 1000.

In one embodiment, the memory system 1000 may be provided as one component in an electronic device. An example of the device may include a computer, UMPC (Ultra Mobile PC), workstation, net-book, PDA (Personal Digital Assistants), portable computer, web tablet, wireless phone, mobile phone, smart phone, e-book, PMP (portable multimedia player), portable game player, navigation device, black box, digital camera, 3-dimensional television, digital audio recorder, digital audio player, digital picture recorder, digital picture player, digital video recorder, digital video player, device with a wireless data communication, at least one electronic device as a home networking component, at least one electronic device as a computer networking component, at least one electronic device as a telematics networking component, at least one electronic device as a computing system component, at least one electronic device as a RIFD device component, or the like.

In one implementation, the semiconductor memory device 100 or memory system 1000 may be packaged in various forms. For example, such packages may include, but be not limited to, PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) or the like.

Figure 11:
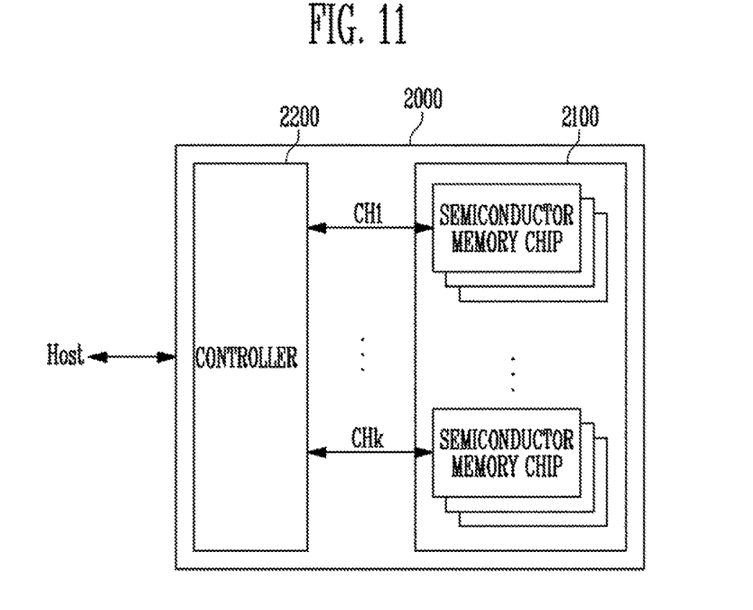
FIG. 11 is a block diagram of one application of the memory system of FIG. 10.

FIG. 11 is a block diagram of one application of the memory system of FIG. 10.

Referring to FIG. 11, a memory system 2000 may include the semiconductor memory device 2100 and controller 2200. The semiconductor memory device 2100 may include a plurality of the semiconductor memory chips. The plurality of the semiconductor memory chips may be divided into a plurality of groups.

In FIG. 11, the plurality of groups communicates respectively through first to k-th channels CH1 to CHk with the controller 2200. Each of the semiconductor memory chips may have the same configuration and operation as in the semiconductor memory device 100 in FIG. 1. Each group may communicate through a single common channel with the controller 2200. The controller 2200 may have the same configuration and operation as in the controller 1100 in FIG. 10. The controller 2200 may control the plurality of memory chips of the semiconductor memory device 2100 through the plurality of channels CH1 to CHk.

Figure 12:
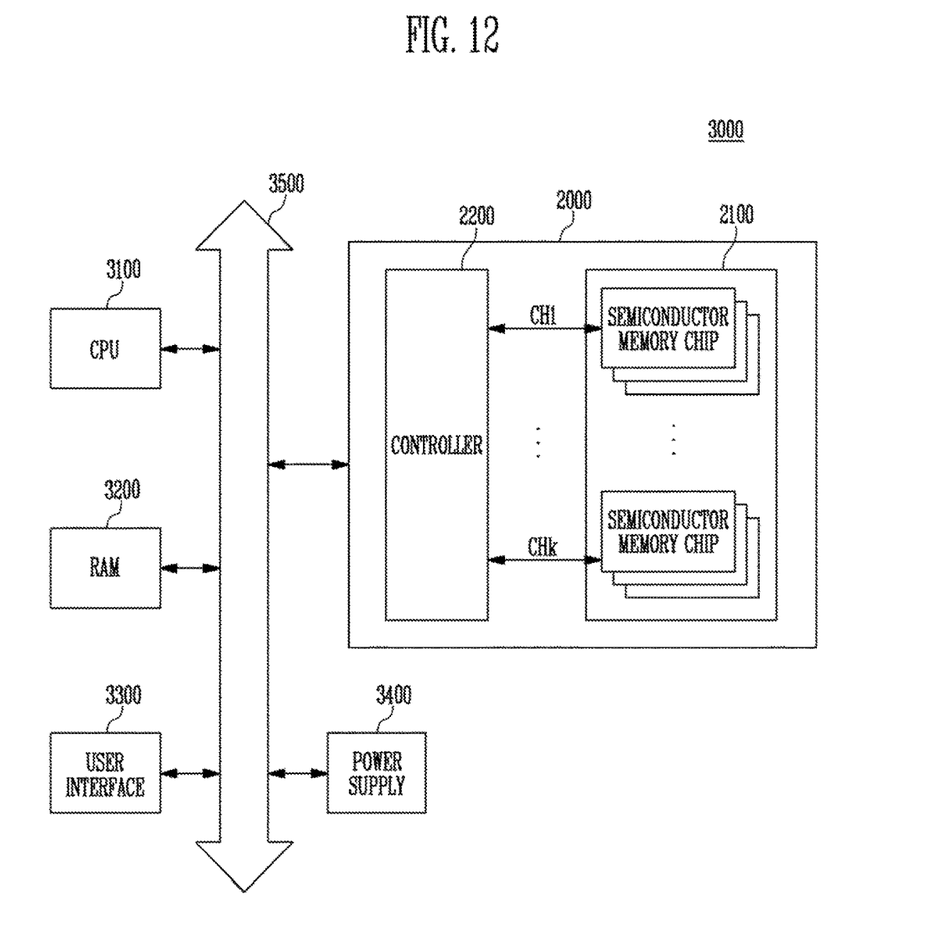
FIG. 12 is a block diagram of a computing system including a memory system.

FIG. 12 is a block diagram of a computing system including the memory system in FIG. 11.

Referring to FIG. 12, a computing system 3000 may include a CPU 3100, RAM 3200 (Random Access Memory), user interface 3300, power-supply 3400, system bus 3500, and memory system 2000.

The memory system 2000 is electrically connected through the system bus 3500 to CPU 3100, RAM 3200, user interface 3300, and power-supply 3400. Data may be supplied through the user interface 3300 or may be processed by the central processing unit 3100 and then may be stored in the memory system 2000.

In FIG. 12, the semiconductor memory device 2100 is connected through the controller 2200 to the system bus 3500. However, the present disclosure is not limited thereto. In one example, the semiconductor memory device 2100 may be directly coupled to the system bus 3500. In this case, functions of the controller 2200 may be covered by the CPU 3100 and RAM 3200.

It may be appreciated that, although in FIG. 12, the memory system 2000 has a configuration in FIG. 11, the memory system 2000 may be replaced with the memory system 1000 in FIG. 10, and/or other suitable memory systems as will be understood to those of skill in the art from the disclosure herein.

In one implementation, the computing system 3000 may include a combination of the memory systems 1000, and 2000 in FIGS. 10 and 11 respectively.

The above description is not to be taken in a limiting sense, but is made merely for the purpose of describing the general principles of exemplary embodiments, and many additional embodiments of this invention are possible. It is understood that no limitation of the scope of the invention is thereby intended. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A semiconductor memory device comprising:
a memory cell array including a first string group and a second string group, wherein the first string group and the second string group each includes memory cell strings, and
wherein each of the memory cell strings includes at least one selection transistor cell;
a peripheral circuit configured to perform a program operation comprising a program voltage application operation on both the first string group and the second string group, and to perform a half page program verification operation; and
a control logic configured to control the peripheral circuit to determine pass or fail of the program operation according to a result of the half page program verification operation,
wherein the control logic controls the peripheral circuit to select one of the first string group and the second string group for the half page program verification operation based on whether an application number of a program voltage applied to both the first string group and the second string group is even or odd.

2. The device of claim 1, wherein the control logic controls the peripheral circuit to alternate repetitions of the half page program verification operation on the first string group and the half page program verification operation on the second string group.

3. The device of claim 2, wherein the control logic controls the peripheral circuit to alternate repetitions of the half page program verification operation on the first string group and the half page program verification operation on the second string group based on each repetition number of the half page program verification operation on the first string group and the half page program verification operation on the second string group.

4. A method of operating a semiconductor memory device having a memory cell array including a first string group of memory cell strings and a second string group of memory cell strings, each memory cell string including at least one selection transistor cell, the method comprising:
performing a program operation on both the first string group and the second string group by applying a program voltage to selection transistor cells included in the first string group and the second string group;
selectively performing a first program verification operation for the first string group or a second program verification operation for the second string group based on an application number of the program voltage applied to both the first string group and the second string group; and
determining pass or fail of the program operation based on a result of the first program verification operation or the second program verification operation, that was performed.

5. The method of claim 4, wherein the selectively performing comprises performing the first program verification operation when the application number is odd.

6. The method of claim 4, wherein the selectively performing comprises performing the first program verification operation when the application number of the program voltage is less than a predetermined value.

7. The method of claim 4, wherein at least one of the memory cell strings included in the first string group and at least one of the memory cell strings included in the second string group are adjacent to each other and share a source-line.

8. The method of claim 4, wherein the selectively performing comprises performing the second program verification operation when the application number is even.

9. The method of claim 4, wherein the selectively performing comprises performing the second program verification operation when the application number of the program voltage is equal to or greater than a predetermined value.

* * * * *